United States Patent
Ramaswamy et al.

(10) Patent No.: US 8,351,242 B2
(45) Date of Patent: Jan. 8, 2013

(54) ELECTRONIC DEVICES, MEMORY DEVICES AND MEMORY ARRAYS

(75) Inventors: D. V. Nirmal Ramaswamy, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 304 days.

(21) Appl. No.: 12/893,992

(22) Filed: Sep. 29, 2010

(65) Prior Publication Data
US 2012/0074373 A1    Mar. 29, 2012

(51) Int. Cl.
G11C 11/00    (2006.01)
G11C 11/34    (2006.01)
H01L 27/105   (2006.01)

(52) U.S. Cl. ..... 365/148; 365/150; 257/4; 257/E27.081; 257/E27.101

(58) Field of Classification Search .................. 365/148, 365/150; 257/4, E27.081, E27.101
See application file for complete search history.

(56) References Cited

U.S. PATENT DOCUMENTS

| 7,405,967 | B2 | 7/2008 | Kozicki et al. |
| 7,751,163 | B2 | 7/2010 | Duch et al. |
| 7,838,861 | B2 * | 11/2010 | Klostermann ..... 257/2 |
| 2005/0250281 | A1 | 11/2005 | Ufert et al. |
| 2008/0029842 | A1 | 2/2008 | Symanczyk |
| 2008/0102278 | A1 | 5/2008 | Kreupl et al. |
| 2009/0085121 | A1 | 4/2009 | Park et al. |
| 2010/0110759 | A1 | 5/2010 | Jin et al. |
| 2010/0163829 | A1 | 7/2010 | Wang et al. |
| 2010/0193758 | A1 | 8/2010 | Tian et al. |
| 2010/0193761 | A1 | 8/2010 | Amin et al. |
| 2010/0193762 | A1 | 8/2010 | Hsieh et al. |

OTHER PUBLICATIONS

Kozicki et al., "Non-Volatile Memory Based on Solid Electrolytes", Non-Volatile Memory Technology Symposium, Nov. 15-17, 2004, pp. 10-17.
Wikipedia, "Programmable metallization cell", Downloaded from http://en.wikipedia.org/wiki/Programmable_metallization_cell on Aug. 24, 2010.

* cited by examiner

Primary Examiner — Evan Pert
(74) Attorney, Agent, or Firm — Wells St. John P.S.

(57) ABSTRACT

Some embodiments include electronic devices having two capacitors connected in series. The two capacitors share a common electrode. One of the capacitors includes a region of a semiconductor substrate and a dielectric between such region and the common electrode. The other of the capacitors includes a second electrode and ion conductive material between the second electrode and the common electrode. At least one of the first and second electrodes has an electrochemically active surface directly against the ion conductive material. Some embodiments include memory cells having two capacitors connected in series, and some embodiments include memory arrays containing such memory cells.

29 Claims, 4 Drawing Sheets

ELECTRONIC DEVICES, MEMORY DEVICES AND MEMORY ARRAYS

TECHNICAL FIELD

Electronic devices, memory devices and memory arrays.

BACKGROUND

Memory is one type of integrated circuitry, and is used in computer systems for storing data. Such is usually fabricated in one or more arrays of individual memory cells. The memory cells might be volatile, semi-volatile, or nonvolatile. Nonvolatile memory cells can store data for extended periods of time, and in many instances including when the computer is turned off. Volatile memory dissipates and therefore requires to be refreshed/rewritten, in many instances including multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. There is a continuing effort to reduce the number of components in individual devices because such can reduce the size of finished constructions, and can simplify processing. The smallest and simplest memory cell will likely be comprised of two current conductive electrodes having a programmable material received between them.

Suitable programmable materials have two or more selectable resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells. Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two conductive electrodes having a programmable material received therebetween. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

An example memory device is a programmable metallization cell (PMC). Such may be alternatively referred to as a conductive bridging RAM (CBRAM), nanobridge memory, or electrolyte memory. A PMC uses ion conductive material (for instance, a suitable chalcogenide or any of various suitable oxides) sandwiched between a pair of current conductive electrodes. A suitable voltage applied across the electrodes generates current conductive super-ionic clusters or conducting filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across electrodes essentially reverses the process and thus removes the conductive paths. A PMC thus comprises a high resistance state (corresponding to the state lacking a conductive filament or clusters between the electrodes) and a low resistance state (corresponding to the state having a conductive filament or clusters between the electrodes), with such states being reversibly interchangeable with one another.

Although there has been some effort toward development of PMC-based memory cells, there remains a need for improved memory cells. Accordingly, it would be desirable to develop new memory cells, and new architectures which incorporate such memory cells into integrated circuitry.

DETAILED DESCRIPTION OF THE ILLUSTRATED EMBODIMENTS

In some embodiments the invention includes novel memory cells incorporating PMC-type structures, and novel memory arrays utilizing such memory cells. Prior to discussing specific memory cells of example embodiments, the operation of a PMC device will be described.

Figure 1:
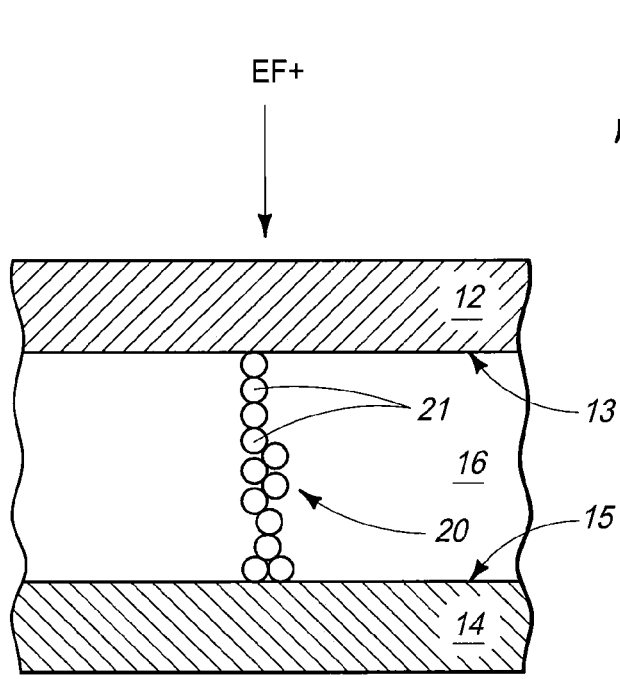
FIGS. 1 and 2 are a diagrammatic view of a PMC in a low resistance state, and a diagrammatic view of the PMC in a high resistance state, respectively.
Figure 2:
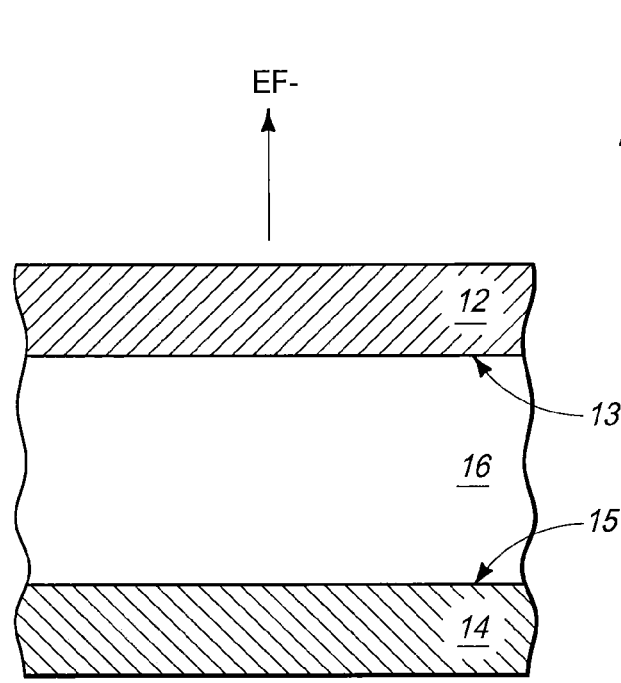

FIGS. 1 and 2 diagrammatically illustrate a PMC device 10 in both a low resistance state (FIG. 1) and a high resistance state (FIG. 2).

FIG. 1 shows the PMC device 10 to comprise ion conductive material 16 (which may be referred to as an electrolyte in some embodiments) between a pair of current conductive electrodes 12 and 14. The electrode 12 comprises a surface 13 which is electrochemically active, while the electrode 14 comprises a surface 15 which is electrochemically inactive.

Electrodes 12 and 14 may comprise any suitable current conductive material, and may be homogenous or non-homogenous. In the context of this document, "current conductive material" is a composition where electric current flow would inherently occur therein predominantly by movement of subatomic positive and/or negative charges when such are generated as opposed to predominantly by movement of ions. At least one of the electrodes 12 and 14 has an electrochemically active surface received directly against ion conductive material 16. By way of examples only, suitable current conductive and electrochemically active materials include copper, silver, and alloys including at least one of copper and silver. Example suitable current conductive and electrochemically inactive materials include titanium nitride, gold, tungsten, platinum, and alloys including at least one of gold, tungsten or platinum.

Ion conductive material 16 may be a solid, gel, or any other suitable phase, and may comprise any suitable composition. In some embodiments the ion conductive material may comprise, consist essentially of or consist of chalcogenide-type material (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and $CuTe$) and/or oxides such as zirconium oxide, hafnium oxide, tungsten oxide, silicon oxide (specifically, silicon dioxide), gadolinium oxide, etc. The ion conductive material may have silver ions or other suitable ions diffused therein for ionic conduction, analogously to structures disclosed in U.S. Pat. No. 7,405,967 and U.S. Patent Publication Number 2010/0193758.

Application of electric field (EF+) across the PMC device 10 forms a current conducting filament 20 of ionic particles 21. The individual ionic particles may be super-ionic clusters, and/or may be individual ions. The filament 20 extends between the electrodes 12 and 14, and thus provides a low-resistance current conduction path through the ion conductive material 16 within the PMC device 10. The device 10 having filament 20 therein may be considered to be in a low-resistance state. The conductive path formed by the particles 21 may comprise the particles directly contacting one another (as shown), or may comprise small gaps between some of the particles.

FIG. 2 shows device 10 as an electric field (EF−) is applied to the device. The electric field (EF−) is of opposite polarity relative to the field (EF+) of FIG. 1, and causes ions to move back to the active surface 13 electrode 12—thereby dissipating the filament 20 (FIG. 1). Accordingly, the low-resistance path provided by such filament is removed, and the device 10 is transitioned into a high-resistance state.

Figure 3:
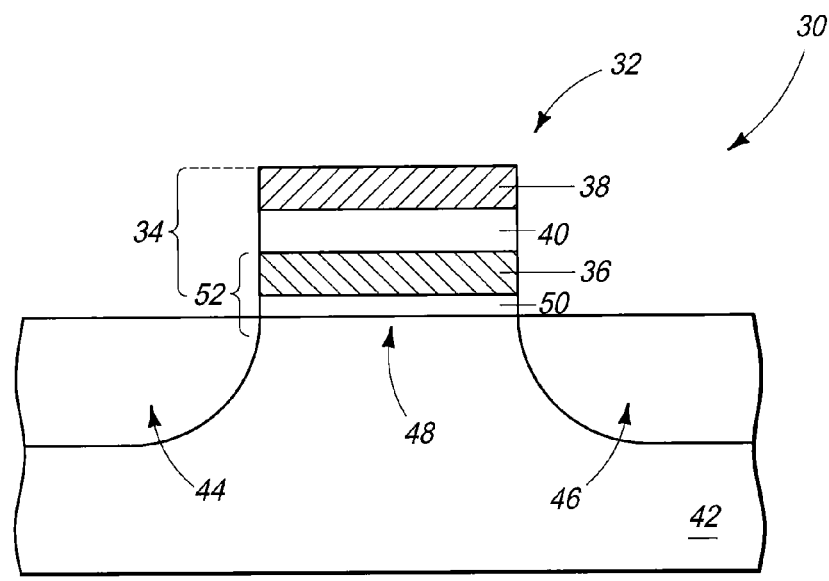
FIG. 3 is a diagrammatic cross-sectional view of a portion of a semiconductor construction illustrating an example embodiment memory cell.

FIG. 3 shows a construction 30 having an example embodiment memory cell 32 that incorporates a region having PMC-type characteristics. Specifically, the memory cell 32 has a PMC-type region 34 comprising a first electrode 36, a second electrode 38, and an ion conductive material 40 between the first and second electrodes. At least one of the first and second electrodes may comprise an electrolytically active surface directly against the ion conductive material 40.

The memory cell 32 is supported by a semiconductor base 42. The semiconductor base may comprise any suitable composition or combination of compositions, and in some embodiments may comprise, consist essentially of, or consist of monocrystalline silicon lightly background doped with appropriate p-type dopant. The semiconductor base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 42 is shown to be homogenous, the base may comprise numerous layers in some embodiments. For instance, base 42 may correspond to a semiconductor substrate containing one or more layers associated with integrated circuit fabrication. In such embodiments, such layers may correspond to one or more of refractory metal layers, barrier layers, diffusion layers, insulator layers, etc.

A pair of source/drain regions 44 and 46 extend into semiconductor base 42. The source/drain regions may be doped with any suitable dopant, and in some embodiments may be heavily doped with n-type dopant.

A channel region 48 is directly between the source/drain regions 44 and 46. The channel region may be doped with any suitable dopant, and in some embodiments may be threshold-voltage doped.

Dielectric 50 is directly over the channel region 48, and the electrode 36 is directly over the dielectric. The electrode 36 is thus spaced from the channel region by the dielectric 50. Dielectric 50 may comprise any suitable composition or combination of compositions. In some embodiments the dielectric 50 may consist of oxide (i.e., may be a dielectric oxide) and may comprise one or more of silicon dioxide, hafnium oxide, zirconium oxide, etc.

The electrode 36, dielectric 50 and underlying channel region 48 together form a capacitor 52. In some embodiments the PMC-type region 34 may be considered a first capacitor, and the capacitor 52 may be considered a second capacitor which is serially connected to the first capacitor, and which shares a common electrode (36) with the first capacitor.

The memory cell 32 comprising the two serially-connected capacitors 34 and 52 may be a nonvolatile memory cell.

The memory cell 32 may be constructed so that one of the electrodes 36 and 38 comprises an electrochemically active surface directly against ion conductive material 40, while the other electrode comprises an electrochemically inactive surface directly against the ion conductive material. The electrochemically active surface is a surface which donates ions to form a filament analogous to the filament 20 of FIG. 1, and the electrochemically inactive surface comprises a material which is incapable of donating such ions. For instance, in embodiments in which the filament will comprise one or both of silver ions and copper ions, the electrochemically active surface may comprise one or both of silver and copper while the electrochemically inactive surface does not comprise either silver or copper. In some embodiments the electrochemically inactive surface may comprise, consist essentially of, or consist of titanium nitride, gold, palladium, platinum, etc.

A problem that may occur in embodiments in which the bottom electrode 36 comprises electrochemically active material is that ions may diffuse from such electrode into dielectric 50. The dielectric 50 may then function as ion conductive material if sufficient voltage is applied across capacitor 52, which can result in formation of a filament (analogous to the filament 20 of FIG. 1) forming across the dielectric 50 to short electrode 36 to the channel region 48. Accordingly, in some embodiments it can be preferred that the upper electrode 38 comprise electrochemically active material, and that the bottom electrode 36 comprise electrochemically inactive material. However, the problem of filament formation across dielectric 50 may be avoided even if the bottom electrode comprises electrochemically active material. For instance, the voltage across capacitor 52 may be kept at levels too low for filament formation. As another example, electrode 36 may be formed of two or more different layers with the upper layer (i.e., the layer which is directly against ion conductive material 40) being electrochemically active material and the lower layer (i.e., the layer which is directly against dielectric 50) being electrochemically inactive material and/or being a barrier to diffusion of ions from the upper layer into the underlying dielectric.

The electrodes 36 and 38 may be of any suitable thickness, and in some embodiments may have thicknesses of from about 5 Å to about 500 Å. The electrodes 36 and 38 may be about the same thickness as one another (as shown), or may be different thicknesses relative to one another. The dielectric 50 and ion conductive material 40 may be of any suitable thicknesses. In some embodiments the dielectric 50 and ion conductive material 40 may have thicknesses of from about 10 Å to about 200 Å, and in some embodiments may have thicknesses of from about 15 Å to about 50 Å. The dielectric 50 and ion conductive material 40 may be about the same thickness as one another, or may be of different thicknesses relative to one another. The relative capacitances of capacitors 34 and 52 may be tailored by, for example, adjusting the thicknesses and compositions of dielectric 50 and ion conductive material 40, adjusting the compositions of electrodes 36 and 38, and/or adjusting the relative doping type and concentration within the channel region 48.

In operation, memory cell 32 may adopt one of two different memory states based upon whether or not a filament (for instance, a filament analogous to the filament 20 of FIGS. 1 and 2) extends across material 40 to electrically interconnect electrodes 36 and 38 to one another. Specifically, if the memory cell 32 is in a state lacking such filament it will have a lower capacitance and a higher threshold voltage than if the memory cell 32 is in a state having the filament. Accordingly, the memory cell may be programmed by inducing either the memory state having the filament, or the memory state lacking the filament; and may be read by determining the capacitance and/or the threshold voltage of the cell to ascertain which of the memory states the cell is in.

Figure 4:
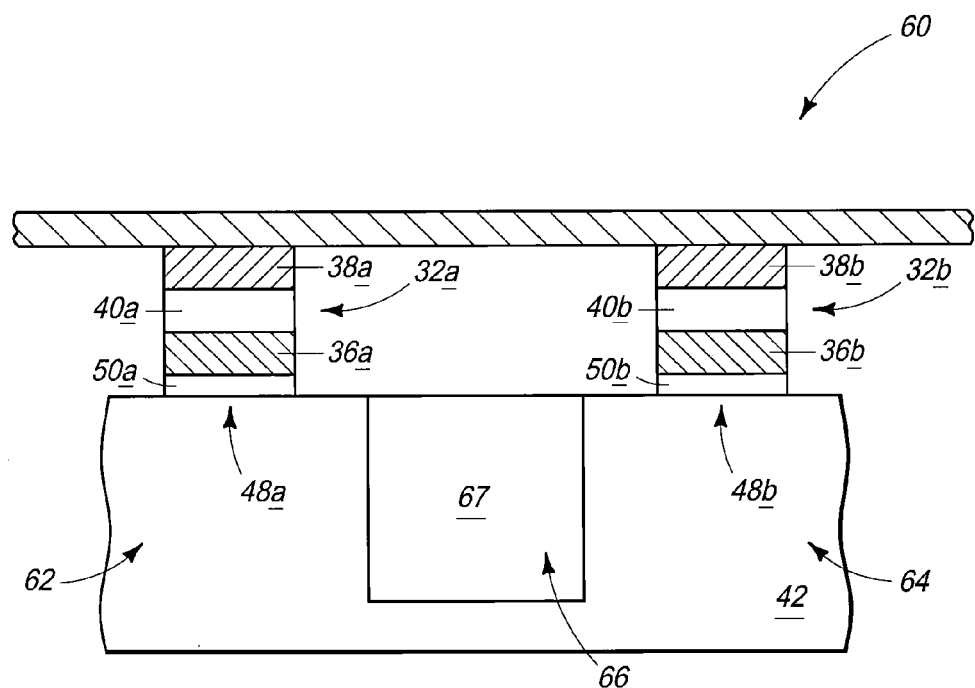
FIGS. 4 and 5 are a diagrammatic cross-sectional view and a diagrammatic three-dimensional view, respectively, of a portion of an example embodiment memory array.
Figure 5:
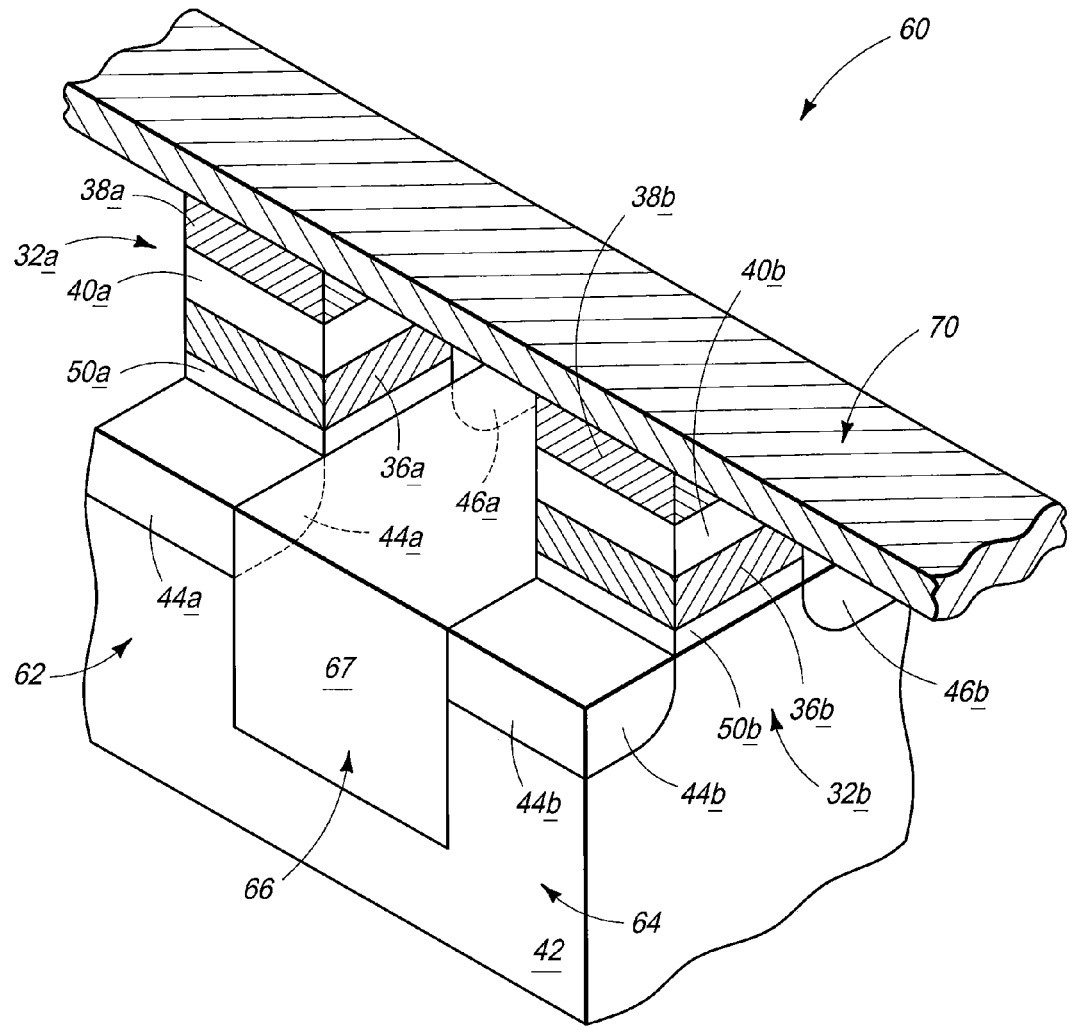

In some embodiments a plurality of memory cells of the type shown in FIG. 3 as cell 32 are incorporated into a memory array. FIGS. 4 and 5 are a diagrammatic cross-sectional view and a three-dimensional view, respectively, of a portion of a construction 60 illustrating a segment of an example embodiment memory array.

The semiconductor substrate 42 is subdivided into a plurality of active regions (with two of the active regions being shown as 62 and 64 in FIGS. 4 and 5) separated from one another by intervening dielectric regions (with an intervening dielectric region being shown as 66 in FIGS. 4 and 5). The intervening dielectric regions contain dielectric material 67. Such dielectric material may comprise any suitable composition or combination of compositions, and in some embodiments may comprise, consist essentially of, or consist of one or both of silicon dioxide and silicon nitride.

The paired source/drain regions 44 and 46 are within the individual active regions; and in the shown embodiment of FIG. 5 paired source/drain regions 44a and 46a are within active region 62, while paired source/drain regions 44b and 46b are within active region 64.

Memory cells 32a and 32b are associated with the active regions 62 and 64, respectively. The memory cells comprise the same components discussed above with reference to FIG. 3. Specifically, memory cell 32a comprises dielectric 50a, first electrode 36a, ion conductive material 40a and second electrode 38a; and similarly memory cell 32b comprises dielectric 50b, first electrode 36b, ion conductive material 40b and second electrode 38b.

An electrically conductive data/sense line 70 (for instance, a bitline or a wordline) extends across the memory cells 32a and 32b. Such line may comprise any suitable electrically conductive composition or combination of compositions; and in some embodiments may comprise, consist essentially of, or consist of one or more of various metals, metal-containing compositions, and conductively-doped semiconductor materials. In some embodiments the shown memory cells may be part of a two-dimensional array comprising rows and columns, and the data/sense line 70 may be considered to interconnect memory cells that are along a common row with one another. Other interconnects may be utilized for connecting memory cells along a common column as one another, and such other interconnects may electrically connect with various of the source/drain regions of the memory cells. The data/sense lines 70 may be considered to be comprised by a first series of interconnects that extend along rows of a memory array, and other interconnects (not shown) may form a second series that extends along columns of the memory array. Each individual memory cell may be uniquely addressed through the combination of one interconnect from the first series, and another interconnect from the second series.

The memory array of FIGS. 4 and 5 shows the ion conductive material 40 patterned into a plurality of spaced-apart features (specifically, features 40a and 40b), with each feature being unique to a memory cell; and similarly shows a top electrode material patterned into a plurality of separate features (specifically, electrodes 38a and 38b) unique to individual memory cells. In some embodiments one or both of the ion conductive material and the top electrode material may be comprised by an expanse that extends across multiple memory cells.

Figure 6:
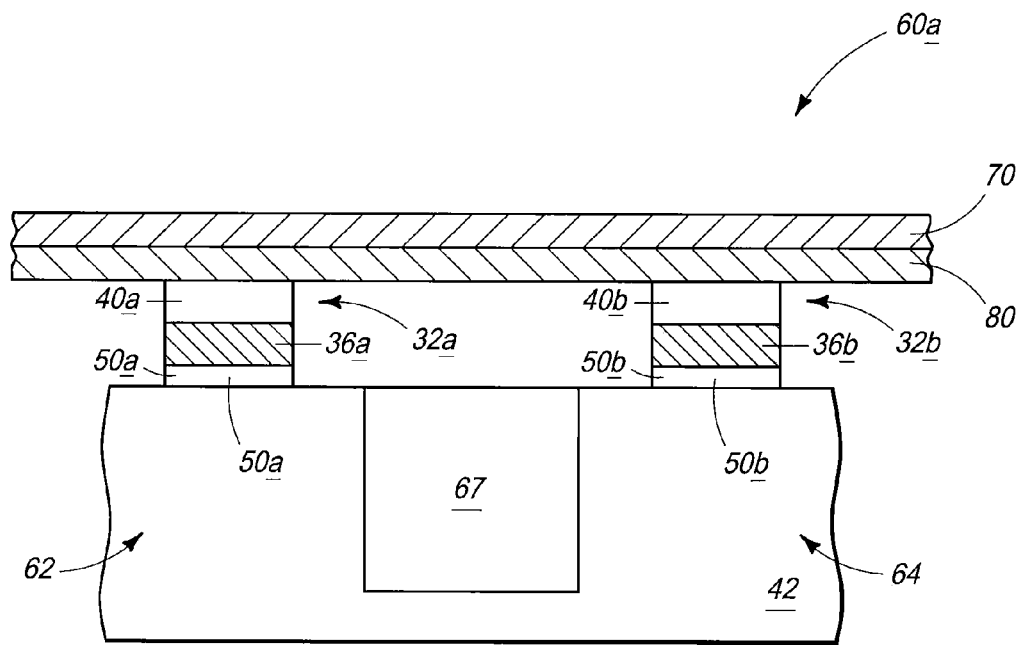
FIG. 6 is a diagrammatic cross-sectional view of a portion of another example embodiment memory array.

FIG. 6 shows a portion of a construction 60a illustrating a segment of an example embodiment memory array in which top electrodes 38a and 38b are replaced by an expanse of top electrode material 80 that extends across multiple memory cells. In some embodiments analogous to that of FIG. 6, the data line 70 may be omitted and instead the top electrode material 80 may be used as both a data line as a top electrode material.

Figure 7:
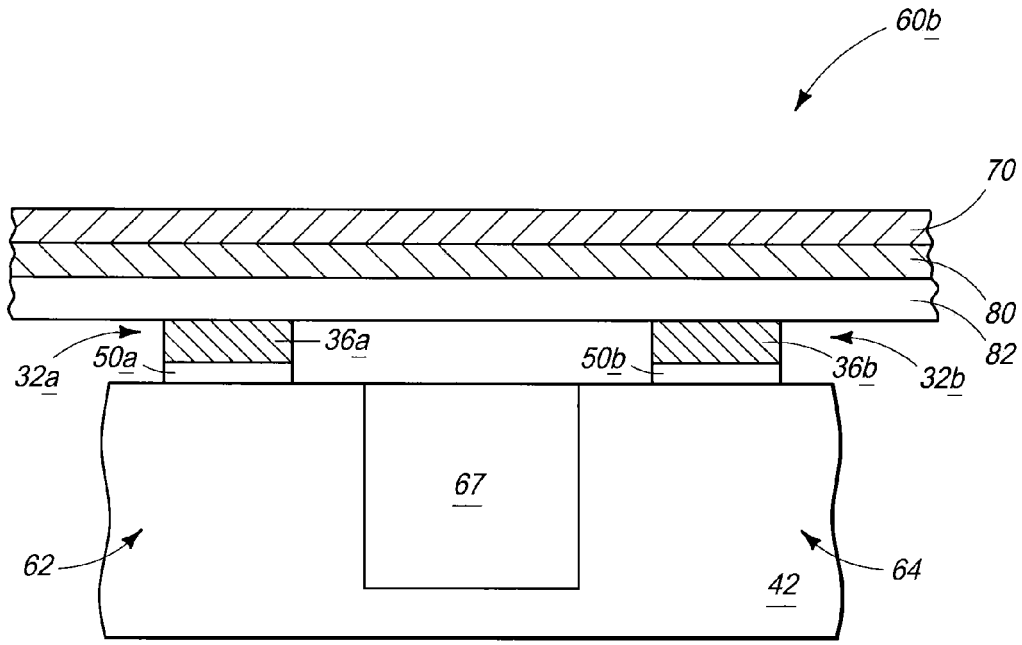
FIG. 7 is a diagrammatic cross-sectional view of a portion of another example embodiment memory array.

FIG. 7 shows a portion of a construction 60b illustrating a segment of an example embodiment memory array in which top electrodes 38a and 38b are replaced by an expanse of top electrode material 80 that extends across multiple memory cells; and in which ion conductive material features 40a and 40b are replaced by an expanse of ion conductive material 82 that extends across multiple memory cells. In some embodiments analogous to that of FIG. 7, the data line 70 may be omitted and instead the top electrode material 80 may be used as both a data line as a top electrode material. The ion conductive material 82 may extend across a plurality of memory cells in the same row as one another (as shown) and/or may extend across memory cells in the same column as one another.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An electronic device comprising two capacitors connected in series and sharing a common electrode; one of said capacitors comprising a region of a semiconductor substrate, with said region being spaced from the common electrode by dielectric; the other of said capacitors comprising a second electrode over the first electrode, with said second electrode being spaced from the first electrode by ion conductive material; wherein at least one of the first and second electrodes has an electrochemically active surface directly against the ion conductive material.

2. The device of claim 1 wherein the region of the semiconductor substrate is a channel region which is directly between a pair of source/drain regions.

3. The device of claim 1 wherein the first electrode has the electrochemically active surface directly against the ion conductive material.

4. The device of claim 3 wherein the second electrode has an electrochemically inactive surface directly against the ion conductive material.

5. The device of claim 1 wherein the second electrode has the electrochemically active surface directly against the ion conductive material.

6. The device of claim 5 wherein the first electrode has an electrochemically inactive surface directly against the ion conductive material.

7. An electronic device, comprising:
a first electrode spaced from an underlying semiconductor substrate by dielectric oxide, the dielectric oxide having a thickness of less than or equal to about 200 Å;
a second electrode over the first electrode, and spaced from the first electrode by ion conductive material; and
wherein one of the first and second electrodes has an electrochemically active surface directly against the ion conductive material and the other of the first and second electrodes has an electrochemically inactive surface directly against the ion conductive material.

8. The device of claim 7 wherein the first electrode has the electrochemically active surface directly against the ion conductive material.

9. The device of claim 7 wherein the second electrode has the electrochemically active surface directly against the ion conductive material.

10. The device of claim 7 wherein the dielectric oxide and the ion conductive material comprise a common composition.

11. The device of claim 7 wherein the dielectric oxide consists of silicon dioxide.

12. The device of claim 7 wherein the ion conductive material comprises one or more oxides.

13. The device of claim 7 wherein the ion conductive material comprises one or more chalcogenides.

14. A memory device, comprising:
a first electrode spaced from an underlying semiconductor substrate by dielectric;
a second electrode over the first electrode, and spaced from the first electrode by ion conductive material;
a pair of source/drain regions extending into the semiconductor substrate adjacent the first electrode, one of the source/drain regions being along one side of the first electrode and the other of the source/drain regions being along another side of the first electrode; and
wherein at least one of the first and second electrodes has an electrochemically active surface directly against the ion conductive material.

15. The device of claim 14 wherein the first electrode has the electrochemically active surface directly against the ion conductive material.

16. The device of claim 15 wherein the second electrode has an electrochemically inactive surface directly against the ion conductive material.

17. The device of claim 14 wherein the second electrode has the electrochemically active surface directly against the ion conductive material.

18. The device of claim 17 wherein the first electrode has an electrochemically inactive surface directly against the ion conductive material.

19. The device of claim 14 wherein the dielectric has a thickness within a range of from about 10 Å to about 200 Å, and wherein the ion conductive material has a thickness within a range of from about 10 Å to about 200 Å.

20. The device of claim 14 wherein the dielectric has a thickness within a range of from about 15 Å to about 50 Å, and wherein the ion conductive material has a thickness within a range of from about 15 Å to about 50 Å.

21. A memory array, comprising:
a plurality of active regions within a semiconductor substrate, the active regions being spaced from one another by intervening dielectric regions; individual active regions having paired source/drain regions extending into semiconductor material of the semiconductor substrate; the paired source/drain regions of each individual active region being spaced from one another by a channel region;
a plurality of spaced apart first electrodes over the semiconductor substrate, each first electrode being directly over a channel region and being spaced from such channel region by dielectric; each first electrode being associated with an individual memory cell of the memory array;
ion conductive material over the first electrodes;
second electrode material over the ion conductive material;
wherein the second electrode material has an electrochemically active surface directly against the ion conductive material; and
wherein the first electrodes have electrochemically inactive surfaces directly against the ion conductive material.

22. The memory array of claim 21 wherein the ion conductive material is an expanse extending across a plurality of the memory cells.

23. The memory array of claim 21 wherein the ion conductive material is a plurality of spaced apart features, with each feature being comprised by only one of the memory cells.

24. The memory array of claim 21 wherein the second electrode material is an expanse extending across a plurality of the memory cells.

25. The memory array of claim 21 wherein the second electrode material is an expanse extending across a plurality of the memory cells along a row of the memory array; and further comprising an electrically conductive data line directly over and against the second electrode material.

26. The memory array of claim 21 wherein the second electrode material is a plurality of spaced apart features, with each feature being comprised by only one of the memory cells.

27. The memory array of claim 21 wherein the ion conductive material is an expanse extending across a plurality of the memory cells; and wherein the second electrode material is an expanse extending across the plurality of the memory cells.

28. The memory array of claim 21 further comprising a conductive data line extending across a row of the memory cells and electrically interconnecting the memory cells along such row with one another.

29. The memory array of claim 21 wherein the dielectric comprises one or more oxides; and wherein the ion conductive material comprises one or more compositions selected from the group consisting of chalcogenides and oxides.

* * * * *